(12) United States Patent
Madhavan

(10) Patent No.: US 9,934,339 B2
(45) Date of Patent: Apr. 3, 2018

(54) APPARATUS AND METHOD FOR SIMULATING MACHINING AND OTHER FORMING OPERATIONS

(71) Applicant: Viswanathan Madhavan, Wichita, KS (US)

(72) Inventor: Viswanathan Madhavan, Wichita, KS (US)

(73) Assignee: Wichita State University, Wichita, KS (US)

( * ) Notice: Subject to any disclaimer, the term of this patent is extended or adjusted under 35 U.S.C. 154(b) by 776 days.

(21) Appl. No.: 14/461,164

(22) Filed: Aug. 15, 2014

(65) Prior Publication Data

US 2016/0048124 A1 Feb. 18, 2016

(51) Int. Cl.
  G05B 19/4097 (2006.01)
  G06F 17/50 (2006.01)

(52) U.S. Cl.
  CPC ..... G06F 17/5009 (2013.01); G05B 19/4097 (2013.01)

(58) Field of Classification Search
  CPC .............. G06F 17/5009; G05B 19/4097
  See application file for complete search history.

(56) References Cited

U.S. PATENT DOCUMENTS

| | | | |
|---|---|---|---|
| 5,377,116 A * | 12/1994 | Wayne | G05B 19/4097 700/175 |
| 5,379,227 A | 1/1995 | Tang et al. | |
| 5,604,893 A | 2/1997 | Burnett et al. | |
| 5,625,575 A | 4/1997 | Goyal et al. | |
| 5,963,459 A | 10/1999 | Burnett et al. | |
| 6,243,663 B1 | 6/2001 | Baty et al. | |
| 6,303,316 B1 | 10/2001 | Kiel et al. | |
| 6,330,523 B1 | 12/2001 | Kacyra et al. | |
| 6,490,528 B2 | 12/2002 | Cheng et al. | |
| 6,516,274 B2 | 2/2003 | Cheng et al. | |
| 6,820,043 B2 | 11/2004 | Mallet et al. | |
| 6,853,922 B2 | 2/2005 | Stark | |
| 6,879,946 B2 | 4/2005 | Rong et al. | |

(Continued)

OTHER PUBLICATIONS

M. Eugene Merchant, "Mechanics of the Metal Cutting Process. I. Orthogonal Cutting and Type 2 Chip", Journal of Applied Physics, vol. 16, No. 5, May 1945, p. 267-275.

(Continued)

*Primary Examiner* — Charles E Anya

(57) ABSTRACT

A method includes obtaining information associated with a forming operation involving a manufacturing machine having a tool that contacts material. The method also includes simulating deformation of the material based on the information. Simulating the deformation of the material includes using discontinuity layout optimization to evaluate combinations of shear planes within an initial structure of the material, predict a mode of deformation comprising one or more of the shear planes along which the initial structure of the material will likely deform, and calculate a deformed shape of the material after an increment of deformation along the predicted mode of deformation. Simulating the deformation of the material also includes repeating the discontinuity layout optimization with the deformed shape of the material as the initial structure.

30 Claims, 10 Drawing Sheets

(56) References Cited

U.S. PATENT DOCUMENTS

| | | | |
|---|---|---|---|
| 6,980,935 | B2 | 12/2005 | Lu et al. |
| 7,024,342 | B1 | 4/2006 | Waite et al. |
| 7,047,165 | B2 | 5/2006 | Balaven et al. |
| 7,324,103 | B2 | 1/2008 | Stewart et al. |
| 7,363,103 | B2 * | 4/2008 | Takahashi ........ G05B 19/40937 700/173 |
| 7,398,696 | B2 | 7/2008 | Koenemann |
| 7,565,276 | B2 | 7/2009 | Song et al. |
| 7,580,819 | B2 | 8/2009 | De et al. |
| 7,657,406 | B2 | 2/2010 | Tolone et al. |
| 8,140,175 | B2 | 3/2012 | Smith et al. |
| 2001/0044709 | A1 | 11/2001 | Fujimori et al. |
| 2001/0047245 | A1 | 11/2001 | Cheng et al. |
| 2002/0007247 | A1 | 1/2002 | Cheng et al. |
| 2002/0016700 | A1 | 2/2002 | Furusu et al. |
| 2002/0032494 | A1 | 3/2002 | Kennon et al. |
| 2002/0095276 | A1 | 7/2002 | Rong et al. |
| 2003/0023383 | A1 | 1/2003 | Stark |
| 2003/0097195 | A1 | 5/2003 | Yamrom et al. |
| 2004/0194051 | A1 | 9/2004 | Croft |
| 2004/0230411 | A1 * | 11/2004 | Zheng ................ B29C 45/7693 703/6 |
| 2005/0253061 | A1 | 11/2005 | Cameron et al. |
| 2005/0267623 | A1 * | 12/2005 | Fang .......................... B23B 1/00 700/160 |
| 2006/0080069 | A1 | 4/2006 | Fujimoto |
| 2006/0241921 | A1 | 10/2006 | Willis |
| 2006/0259283 | A1 | 11/2006 | Brughmans et al. |
| 2007/0268288 | A1 * | 11/2007 | Duriez ................ G06F 17/5018 345/420 |
| 2009/0265030 | A1 * | 10/2009 | Huang ................ G05B 19/4068 700/182 |
| 2010/0174515 | A1 * | 7/2010 | Madhavan .......... G06F 17/5018 703/2 |
| 2012/0232854 | A1 * | 9/2012 | Muller-Fischer ... G06F 17/5009 703/1 |
| 2013/0030781 | A1 * | 1/2013 | Yoneda .............. G05B 19/4069 703/6 |
| 2013/0262066 | A1 * | 10/2013 | Erdim ................ G06F 17/5086 703/7 |
| 2014/0088746 | A1 * | 3/2014 | Maloney ................ B25J 9/1684 700/97 |
| 2014/0114458 | A1 * | 4/2014 | Miyata ............... G05B 19/4069 700/98 |

OTHER PUBLICATIONS

Viswanathan Madhavan, "Investigations Into the Mechanics of Metal Cutting", A Thesis Submitted to the Faculty of Purdue University, Dec. 1996, 103 pages.

M. Eugene Merchant, "Mechanics of the Metal Cutting Process. II. Plasticity Conditions in Orthogonal Cutting", Journal of Applied Physics, Nov. 15, 1944, p. 318-324.

Viktor P. Astakhov, "On the inadequacy of the single-shear plane model of chip formation", International Journal of Mechanical Sciences 47 (2005), Jul. 20, 2005, p. 1649-1672.

Halil Bil et al., "A comparison of orthogonal cutting data from experiments with three different finite element models", International Journal of Machine Tools & Manufacture 44 (2004), Jan. 21, 2004, p. 933-944.

T. Tyan et al., "Analysis of Orthogonal Metal Cutting Processes", International Journal for Numerical Methods in Engineering, vol. 34, (1992), received Aug. 30, 1990, p. 365-389.

Morten F. Villumsen et al., "Prediction of Cutting Forces in Metal Cutting, Using the Finite Element Method, a Lagrangian Approach", DYNAmore Gmbh, 2008, 16 pages.

Cenk Kilicaslan, "Modelling and Simulation of Metal Cutting by Finite Element Method", A Thesis submitted to the Graduate School of Engineering and Sciences of Izmir Institute of Technology in Partial Fulfilment of the Requirements for the Degree of Master of Science in Mechanical Engineering, Dec. 2009, 86 pages.

M. Saket Kashani et al., "Study of Damage distribution over the Primary Shear Zone in the Metal Cutting using Nanoindentation", Proceedings of the 3rd Annual GRASP Symposium, Wichita State University, 2007, p. 31-32.

Kimberly Reuter et al., "Development of a finite element model to study the torsional fracture strength of an analogue tibia with bicortical holes", Int. J. Experimental and Computational Biomechanics, vol. 2, No. 2, 2013, p. 158-170.

R. N. Roth et al., "Slip-Line Field Analysis for Orthogonal Machining Based Upon Experimental Flow Fields", Journal Mechanical Engineering Science, vol. 14, No. 2, 1972, p. 85-97.

Daniel J. Waldorf et al., "A Slip-Line Field for Ploughing During Orthogonal Cutting", J. Manuf. Sci. Eng 120(4), Nov. 1, 1998, p. 693-699.

Cecil Reid Attaway, "An Analysis of the Orthogonal Metal Cutting Process", A Thesis Presented to The Faculty of the Graduate Division, Georgia Institute of Technology, Dec. 1968, 192 pages.

Amir H. Adibi-Sedeh et al., "A Hybrid Model for Analysis of 3-D Machining Operations", Journal of Manufacturing Systems, vol. 22, No. 4, 2003, p. 309-316.

Amir H. Adibi-Sedeh et al., "Extension of Oxley's Analysis of Machining to Use Different Material Models", Transactions of the ASME, vol. 125, Nov. 2003, p. 656-666.

Amit Deshpande et al., "A novel approach to accelerate attainment of thermal steady state in coupled thermomechanical analysis of machining", International Journal of Heat and Mass Transfer, Apr. 21, 2012, p. 3869-3884.

Mahdi Saket Kashani et al., "Volumes sampled for hardness and for modulus of elasticity during nanoindentation testing", J. Mater. Res., vol. 27, No. 12, Jun. 28, 2012, p. 1553-1564.

* cited by examiner

APPARATUS AND METHOD FOR SIMULATING MACHINING AND OTHER FORMING OPERATIONS

TECHNICAL FIELD

This disclosure relates generally to simulation systems. More specifically, this disclosure relates to an apparatus and method for simulating machining and other forming operations.

BACKGROUND

Various techniques are known for forming metal or other manufactured parts, such as "subtractive manufacturing" in which portions of a larger piece of material are removed to form a manufactured part. Subtractive manufacturing or material removal from a ductile material is a special type of operation with large localized deformations and can be modeled as a forming operation. Subtractive manufacturing operations often involve cutting operations (such as turning, milling, and boring operations) and other "forming" operations performed by computer numerical control (CNC) machines. A large subtractive manufacturing facility could include many CNC machines, which can consume enormous amounts of energy and require the use of large amounts of coolant for the CNC machines.

Some attempts have been made to model what happens to material during forming operations, but these approaches have generally been inadequate for various reasons. For example, finite element analysis (FEA) has been attempted to model the behavior of material during forming operations, but FEA approaches often require large amounts of computational resources and are very time-consuming. Eulerian and Arbitrary Lagrangian Eulerian (ALE) analyses can generate solutions using less computational resources but have other shortcomings, such as the inability to handle large localized material deformations or to track material interfaces.

SUMMARY

This disclosure provides an apparatus and method for simulating machining and other forming operations.

In a first embodiment, a method includes obtaining information associated with a forming operation involving a manufacturing machine having a tool that contacts material. The method also includes simulating deformation of the material based on the information. Simulating the deformation of the material includes using discontinuity layout optimization to evaluate combinations of shear planes within an initial structure of the material, predict a mode of deformation comprising one or more of the shear planes along which the initial structure of the material will likely deform, and calculate a deformed shape of the material after an increment of deformation along the predicted mode of deformation. Simulating the deformation of the material also includes repeating the discontinuity layout optimization with the deformed shape of the material as the initial structure.

In a second embodiment, an apparatus includes at least one memory configured to store obtaining information associated with a forming operation involving a manufacturing machine having a tool that contacts material. The apparatus also includes at least one processing device configured to simulate deformation of the material based on the information. The at least one processing device is configured to simulate the deformation of the material by using discontinuity layout optimization to evaluate combinations of shear planes within an initial structure of the material, predict a mode of deformation comprising one or more of the shear planes along which the initial structure of the material will likely deform, and calculate a deformed shape of the material after an increment of deformation along the predicted mode of deformation. The at least one processing device is also configured to simulate the deformation of the material by repeating the discontinuity layout optimization with the deformed shape of the material as the initial structure.

In a third embodiment, a non-transitory computer readable medium embodies a computer program. The computer program includes computer readable program code for obtaining information associated with a forming operation involving a manufacturing machine having a tool that contacts material. The computer program also includes computer readable program code for simulating deformation of the material based on the information. Simulating the deformation of the material includes using discontinuity layout optimization to evaluate combinations of shear planes within an initial structure of the material, predict a mode of deformation comprising one or more of the shear planes along which the initial structure of the material will likely deform, and calculate a deformed shape of the material after an increment of deformation along the predicted mode of deformation. Simulating the deformation of the material also includes repeating the discontinuity layout optimization with the deformed shape of the material as the initial structure.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 9, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
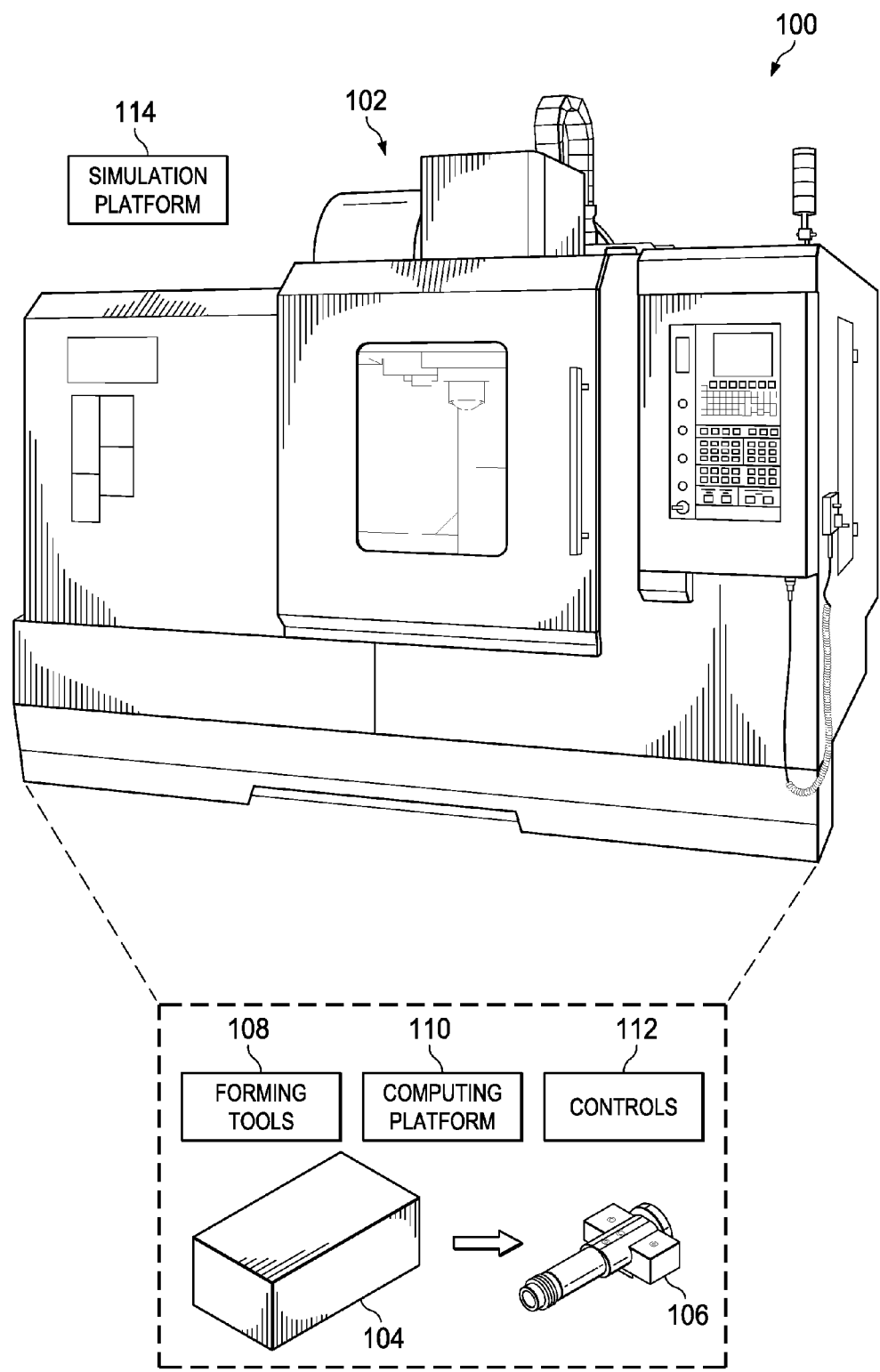
FIG. 1 illustrates an example subtractive manufacturing system according to this disclosure.

FIG. 1 illustrates an example subtractive manufacturing system 100 according to this disclosure. As shown in FIG. 1, the system 100 includes a computer numerical control (CNC) manufacturing machine 102. The machine 102 generally denotes a structure that supports one or more subtractive manufacturing operations, such as one or more operations used to convert material 104 into a manufactured part 106. The material 104 could have any suitable size, shape, and dimensions and could represent any suitable material(s). The material 104 shown in FIG. 1 is merely representative of one example piece of material that could be processed. Also, the manufactured part 106 could represent any suitable intermediate or final product that is formed by one or more subtractive manufacturing operations. The manufactured part 106 shown in FIG. 1 is merely representative of one example manufactured part that could be created.

In this example, the machine 102 includes one or more forming tools 108, such as one or more blades, drill bits, end mills, probes, dies, or other components. Forming tools 108 such as probes could be used to measure one or more characteristics of the material 104 before, during, or after fabrication of the manufactured part 106 or one or more characteristics of the manufactured part 106. Forming tools 108 such as blades, drill bits, and end mills could be used to perform turning, milling, boring, or other forming operations to remove portions of the material 104 to form the manufactured part 106. Depending on the implementation, the machine 102 could include a single tool, multiple tools of the same type, or multiple tools of different types. If multiple tools are used, the machine 102 could include one or more spindles or other structures that hold the tools and allows different tools to be extracted and used.

Operations of the forming tools 108 are controlled by a computing platform 110. The computing platform 110 could be programmed to support the manufacture of one or multiple manufactured parts 106. For example, the computing platform 110 could receive a selection of a particular manufactured part 106 (such as from a user), select the appropriate tools 108 for use in creating the selected manufactured part 106, and control forming operations performed by the machine 102 using the selected tools 108. The computing platform 110 represents any suitable computing device that supports forming operations.

Various controls 112 can be used to support operator interactions with the CNC manufacturing machine 102. For example, the controls 112 could allow an operator to initiate production of a particular manufactured part 106, pause or halt production of a manufactured part 106, or provide other commands to the computing platform 110. The controls 112 represent any suitable structures configured to interact with and receive information from an operator.

This represents a brief description of one type of manufacturing system 100 that may be used to produce manufactured products. Additional details regarding CNC manufacturing machines are well-known in the art and are not needed for an understanding of this disclosure.

As noted above, a large subtractive manufacturing facility could include many CNC manufacturing machines 102, which can consume enormous amounts of energy and require the use of large amounts of coolant. The ability to optimize the operations performed by CNC manufacturing machines 102 could have many benefits. For example, optimizing the operations of CNC manufacturing machines 102 could reduce energy consumption and coolant usage. Moreover, optimizing the operations of CNC manufacturing machines 102 could lengthen the operational lifespans of the forming tools 108 and increase the quality of the manufactured parts 106.

In order to optimize the operations of CNC manufacturing machines 102, it would be useful to have process models that are based on analytical techniques arising from plasticity theory. These models could be used to obtain answers to questions about loads, temperatures, and "chip" types created during forming operations (a "chip" refers to a portion of the material 104 removed during a forming operation). Moreover, these models could lead to a better understanding of the actual processes that are occurring in CNC manufacturing machines 102, allowing those processes to be improved or optimized.

Unfortunately, prior attempts to model what happens to material during forming operations have generally been inadequate. For example, finite element analyses (FEAs) have been used for several years, and efforts have been made to improve material constitutive models and friction models in order to improve the accuracy of FEA results. However, it has been observed that knowledge of these models is so tenuous that the rigors of FEA are unnecessary, and equally useful results may be obtained using simpler modeling techniques. This observation likely holds true for many metal forming processes under both cold and hot forming conditions. In the current generation of FEA tools, a vast amount of computational effort is expended to obtain a steady-state solution to a continuous flow process, such as machining. The inability to quickly evolve/converge to steady-state deformation and temperature fields is countered by running these analyses for long times, making these analyses complex, costly, and time-consuming.

Newer techniques, such as Eulerian analysis or Arbitrary Lagrangian Eulerian (ALE) analysis, can produce solutions using a lesser amount of computational resources for some problems, typically with reduced resolution. Unfortunately, Eulerian analysis typically cannot track material interfaces and enforce frictional boundary conditions well, and problems sometimes arise during ALE analysis due to an inability of meshing and smoothing algorithms to handle large localized deformations in material.

Two commonly-encountered types of chips of material that are created during forming operations are "continuous" and "shear banded" (segmented) chips. The challenges in modeling the formation of segmented chips are considerably greater than in modeling the formation of continuous chips. This is where the weaknesses of Eulerian and ALE analyses also typically come to the fore.

This disclosure recognizes that strain rate distribution within a shear plane (more accurately the primary shear zone or "PSZ") of the material 104 adjusts itself so that flow stress is nearly constant. Strain hardening, strain rate hardening, and thermal softening of the material 104 act together to cause the flow stress to be nearly constant within the PSZ. This permits the use of analytical techniques, such as kinematic analysis and slip line field (SLF) modeling, to model forming operations.

As described in more detail below, a simulation platform 114 can implement discontinuity layout optimization (DLO) in order to model what occurs during forming operations within one or more CNC manufacturing machines 102. This functionality allows the behaviors of the CNC manufacturing machines 102 to be predicted faster and with greater accuracy, which allows a wide variety of analyses to be performed. For example, the simulations can provide the ability to improve or optimize the operations performed by the CNC manufacturing machines 102, which could help to increase productivity, reduce energy consumption or coolant usage, lengthen the operational lifespans of the forming tools 108, or increase the quality of the manufactured parts 106.

Additional details regarding the simulation platform 114 are provided below. The simulation platform 114 includes any suitable structure for simulating forming operations in one or more CNC manufacturing machines. For example, the simulation platform 114 could include a desktop computer, laptop computer, server computer, or other suitable computing device.

Although FIG. 1 illustrates one example of a subtractive manufacturing system 100, various changes may be made to FIG. 1. For example, the manufacturing system 100 could include any number of CNC manufacturing machines 102, and one or more simulation platforms 114 could be used to model the behaviors of the CNC manufacturing machine(s) 102.

Figure 2:
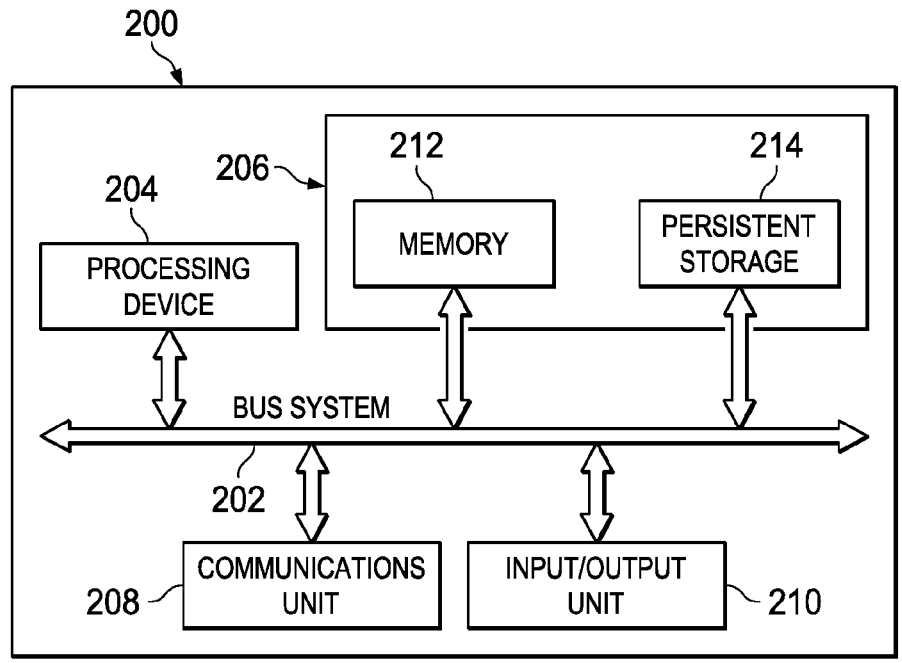
FIG. 2 illustrates an example device supporting simulation of machining and other forming operations according to this disclosure.

FIG. 2 illustrates an example device 200 supporting simulation of machining and other forming operations according to this disclosure. The device 200 could, for example, be used to implement the simulation platform 114 of FIG. 1.

As shown in FIG. 2, the device 200 includes a bus system 202. The bus system 202 is configured to support communication between at least one processing device 204, at least one storage device 206, at least one communications unit 208, and at least one input/output (I/O) unit 210.

The processing device 204 is configured to execute instructions that can be loaded into a memory 212. The device 200 can include any suitable number(s) and type(s) of processing devices 204 in any suitable arrangement. Example processing devices 204 can include microprocessors, microcontrollers, digital signal processors, field programmable gate arrays, application specific integrated circuits, and discrete circuitry. The processing device(s) 204 can be configured to execute processes and programs resident in the memory 212.

The memory 212 and a persistent storage 214 can represent any structure(s) capable of storing and facilitating retrieval of information (such as data, program code, or other suitable information on a temporary or permanent basis). The memory 212 can represent a random access memory or any other suitable volatile or non-volatile storage device(s). The persistent storage 214 can contain one or more components or devices supporting longer-term storage of data, such as a ready only memory, hard drive, Flash memory, or optical disc.

The communications unit 208 is configured to support communications with other systems or devices. For example, the communications unit 208 can include a network interface card or a wireless transceiver facilitating communications over the network 103. The communications unit 208 can be configured to support communications through any suitable physical or wireless communication link(s).

The I/O unit 210 is configured to allow for input and output of data. For example, the I/O unit 210 can be configured to provide a connection for user input through a keyboard, mouse, keypad, touchscreen, or other suitable input device. The I/O unit 210 can also be configured to send output to a display, printer, or other suitable output device.

Although FIG. 2 illustrates one example of a device 200 supporting simulation of machining and other forming operations, various changes may be made to FIG. 2. For example, various components in FIG. 2 could be combined, further subdivided, or omitted and additional components could be added according to particular needs. In general, computing devices can come in a wide variety of configurations, and FIG. 2 does not limit this disclosure to any particular computing device.

Figure 3:
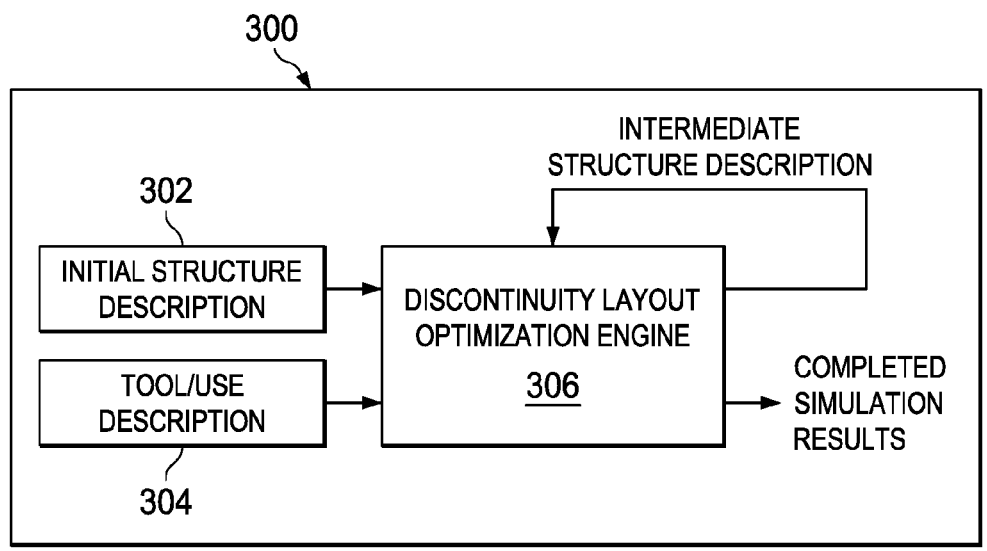
FIG. 3 illustrates an example functional architecture of a simulator supporting simulation of machining and other forming operations according to this disclosure.

FIG. 3 illustrates an example functional architecture 300 of a simulator supporting simulation of machining and other forming operations according to this disclosure. The architecture 300 shown in FIG. 3 could, for example, be supported by the device 200 operating as the simulation platform 114 in the system 100 of FIG. 1. The architecture 300 shown in FIG. 3 could be supported by any other suitable device operating in any other suitable system.

As shown in FIG. 3, the simulator receives an initial description 302 of a material and a description 304 of a tool and the tool's intended use. The initial description 302 of the material can represent a description of the material 104 to be formed into a manufactured part 106. The initial description 302 could include a description of the size, shape, and dimensions of the material 104 and a description of how the material 104 is held in place within the CNC manufacturing machine 102. The description 304 can identify the size, shape, and dimensions of a tool 108 to be used to remove chips from the material 104 in order to shape the material 104 as desired. The description 304 can also identify how the tool 108 is intended to move against the material 104 to remove chips from the material 104.

The descriptions 302-304 can be obtained from any suitable source and in any suitable manner. For example, the descriptions 302-304 could be obtained from a user or from information stored in models or other data structures.

The initial description 302 of the material 104 and the description 304 of the tool 108 are provided to a DLO engine 306. Discontinuity layout optimization is an engineering analysis technique designed to establish the amount of load that can be carried by a solid or by a structure prior to collapse. For example, discontinuity layout optimization can be used to design and optimize buildings, excavations, and the like to avoid the possibility of unconstrained deformation (collapse).

Figure 4A:
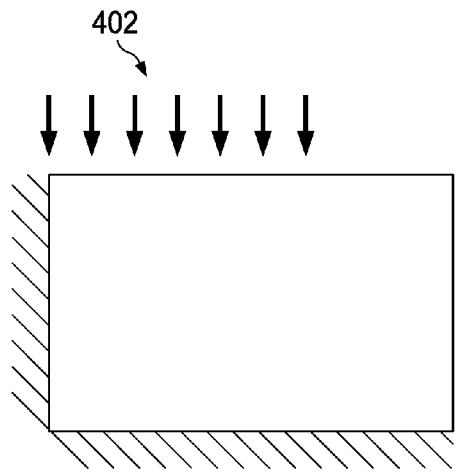
FIGS. 4A through 4D illustrate an example simulation technique used for simulation of machining and other forming operations according to this disclosure.
Figure 4B:
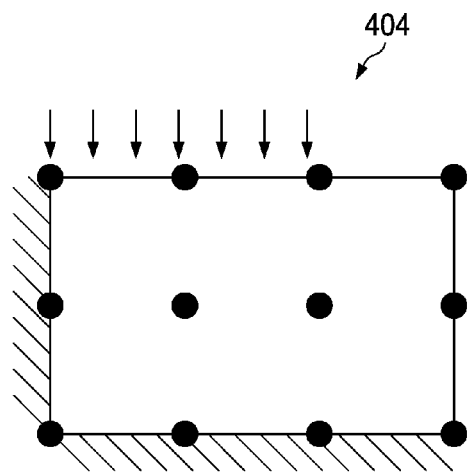
Figure 4C:
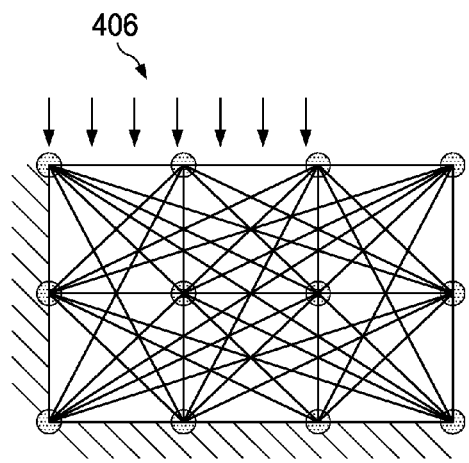
Figure 4D:
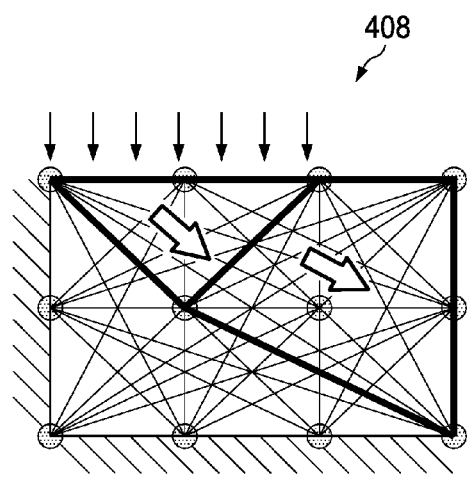

This disclosure uses the abilities of discontinuity layout optimization to identify and evaluate various possible modes of deformation and predict how material 104 will be deformed in a CNC manufacturing machine 102 due to contact with a tool 108. The DLO engine 306 operates by taking the initial description 302 of the material 104 and the description 304 of the tool 108 and identifying shear planes within the initial structure of the material 104 and the likely plane(s) along which the initial structure of the material 104 will shear, flow, or otherwise deform. FIGS. 4A through 4D illustrate an example simulation technique used for simulation of machining and other forming operations according to this disclosure. In FIG. 4A, an initial structure is defined, where a force is to be applied to the structure. In FIG. 4B, the structure is "discretized" using various nodes. In FIG. 4C, the various nodes of the structure are interconnected with potential discontinuities, which represent possible shear planes within the structure. In FIG. 4D, a critical subset of discontinuities (active shear planes) are identified and shown using thick lines. That critical subset of shear planes and the relative sliding of adjacent blocks along these shear planes together constitute a predicted mode of deformation of the structure. Additional details regarding how discontinuity layout optimization operates can be found in U.S. Pat. No. 8,140,175 (which is hereby incorporated by reference).

Once the DLO engine 306 predicts how the initial structure of the material 104 will likely deform, the DLO engine 306 calculates the structure resulting from an increment of deformation along the predicted mode of deformation and feeds the resulting structure back as an intermediate structure description. The discontinuity layout optimization simulations can then be repeated to identify shear planes within the current structure of the material 104 and the likely plane(s) along which the current structure of the material 104 will deform. This results in another intermediate structure, which can again be fed back so that the process can repeat. Over a number of iterations, the DLO engine 306 simulates how chips of the material 104 might be removed during operation of the CNC manufacturing machine 102. At some point, such as after a specified number of iterations, the information generated by the DLO engine 306 can be provided as complete simulation results.

The DLO engine 306 includes any suitable logic for performing discontinuity layout optimization. For example, computer software implementing discontinuity layout optimization could be obtained from LIMITSTATE LTD. of Sheffield, United Kingdom.

As noted above, this disclosure recognizes that the strain rate distribution within a primary shear zone of a material 104 adjusts itself so that flow stress is nearly constant. However, since the value of the flow stress to be used depends upon the strain, temperature, and strain rate, the DLO engine 306 accepts specification of flow stress in terms of other variables (such as strain, temperature and strain rate in the case of machining, pore pressure in the case of soils, etc.). The correct flow stress over each local volume of material 104 is computed using a constitutive or material model with local strain, temperature, strain rate, etc. as the variables. For example, the Johnson-Cook model has the form:

$$\sigma = (A + B\varepsilon^n) \times \left(1 + C \times \ln\frac{\dot{\varepsilon}}{\dot{\varepsilon}_0}\right) \times \left(1 - \left(\frac{T - T_{room}}{T_{melt} - T_{room}}\right)^m\right)$$

If values for parameters used in the constitutive model (such as A, B, n, C, and m for the Johnson-Cook model) are unavailable, the parameter values can be established in any suitable manner, such as by machining tests or using standard high strain rate tests.

In machining, the orientation of the shear plane about the tip of the tool is typically unconstrained by the tool and is determined as part of the solution. Energy minimization (which is used by DLO) can be applied even to problems with free boundaries in order to predict the shear plane orientation. It has been observed that the solutions given by FEA simulations can be reproduced by SLF models to which energy minimization is applied in order to choose a particular solution from a class of solutions, while also ensuring satisfaction of other constraints.

Figure 5:
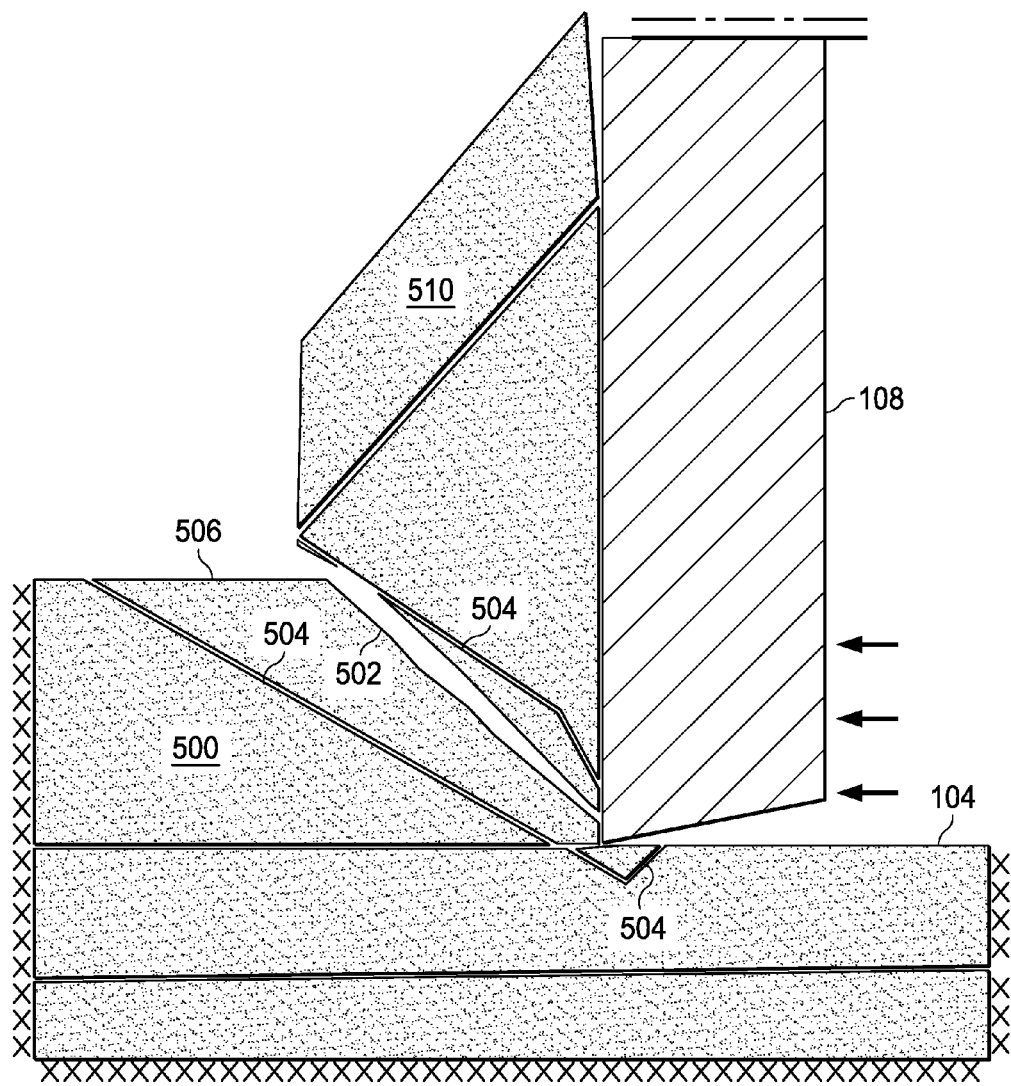
FIGS. 5 and 6 illustrate example forming operations that can be simulated according to this disclosure.
Figure 6:
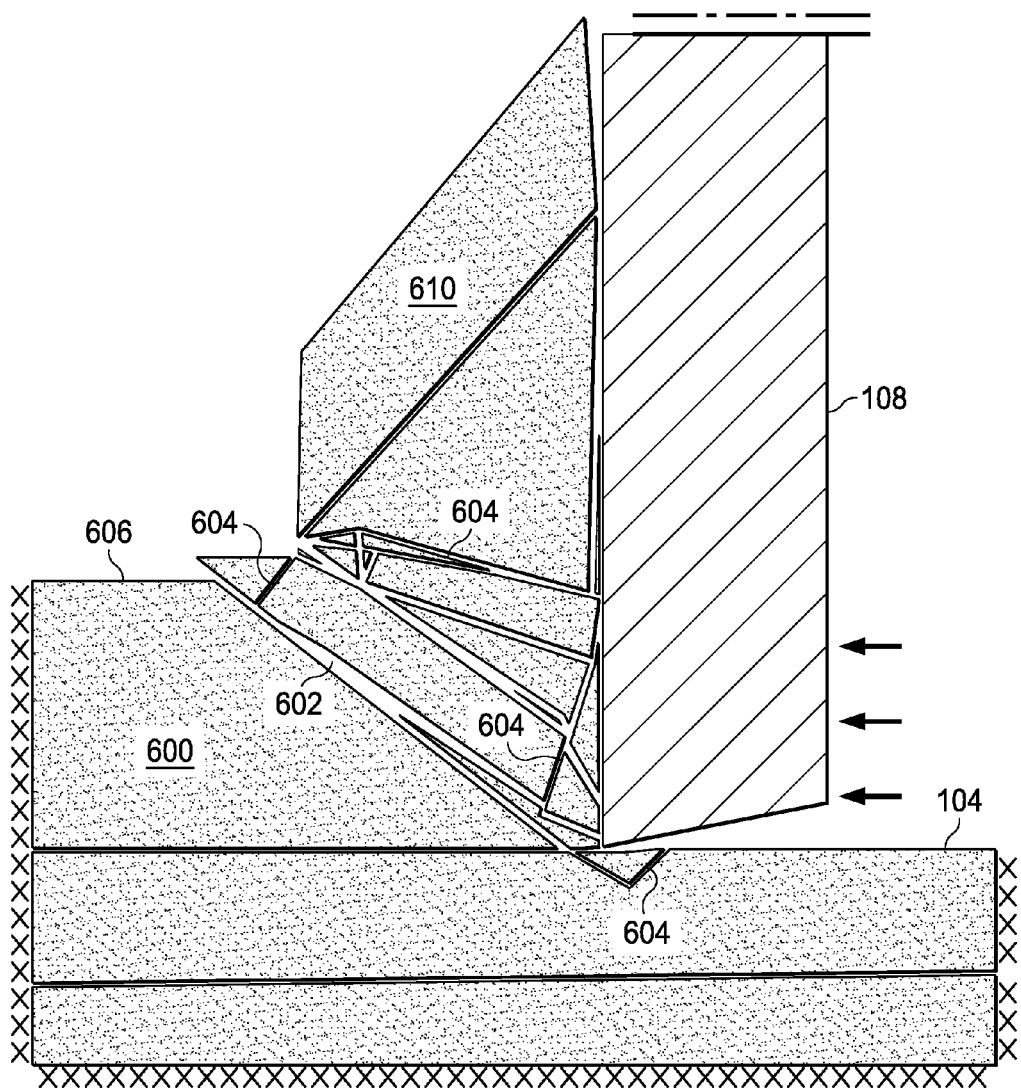

Examples of forming operations that can be simulated according to this disclosure are shown in FIGS. 5 and 6. In FIGS. 5 and 6, the tool 108 is shown as contacting the material 104 and creating various shear planes 502-504, 602-604 along which the material 104 can deform. In FIG. 5, a lesser amount of friction is assumed, and the material 104 is predicted to deform mainly along the shear plane 502, also called the "primary shear plane" (or "primary shear zone" for a strain hardening material). The shear plane 502 is of smaller length compared to shear plane 602 and forms a thin chip 510. In FIG. 6, a greater amount of friction is assumed, so the material 104 is observed to deform mainly along the shear plane 602 of greater length (compared to the shear plane 502) to form a thick chip 610. Other shear planes 504 and 604 are also indicated to be active as part of the solution, but the amount of sliding along those is small, which implies lower strain rate along those shear planes. The strain rate along a shear plane $\dot{\varepsilon}$ can be calculated as $\dot{\varepsilon} = \Delta v/\Delta l$, where $\Delta v$ is the shear velocity along the shear plane (or the slip distance per unit time, which can be calculated knowing the increment of time over which the increment of deformation occurs) and $\Delta l$ is the smaller value among the local DLO grid spacing (the spacing between nodes in the DLO block, such as is shown in FIG. 4B) and the local distance to the adjacent shear plane(s).

Similarly, the increment of strain (over and above other increments of strain imposed on the same local region of material earlier by other shear planes, during other increments of deformation prior to the current increment of deformation) due to a shear plane can be calculated as $\varepsilon = \Delta s/\Delta n = v_s/v_\perp$. Here, $v_\perp$ is the component of material velocity perpendicular to the shear plane (and measured relative to the shear plane), $\Delta s$ is the slip distance along the shear plane, and $\Delta n$ is the amount of material movement perpendicular to the shear plane (again measured relative to the shear plane).

The mechanical energy consumed in an increment of deformation along a local extent (length in a two-dimensional analysis considering unit depth into the plane or area in a three-dimensional analysis) of a shear plane is equal to the product of the local flow stress of the material, the local extent of the shear plane, and the slip distance along the shear plane during the increment of deformation. A large fraction (the Taylor-Quinney parameter, typically 0.9 or higher) of the mechanical energy consumed in deformation is converted into heat, which can be considered to be liberated at the local length or area of the shear plane. The transfer of heat through the material determines the temperature distribution within the material and can be calculated using standard techniques of heat transfer, such as those given by Carslaw et al., "Conduction of heat in solids," Oxford University Press, 1959 (which is hereby incorporated by reference in its entirety).

Various additional functions could be performed as part of the simulation technique performed by the DLO engine 306. For example, a check can be made if limits on intensities of stress at pressure singularities within the material 104 are satisfied, such as is stipulated in Hill, "On the limits set by plastic yielding to the intensity of singularities of stress," Journal of the Mechanics and Physics of Solids, Volume 2, Issue 4, June 1954, pages 278-285 (which is hereby incorporated by reference in its entirety). Predicted solutions that violate the limits can be excluded.

As another example, the DLO analysis can be extended to allow the geometry of the material 104 to evolve in steady-flow problems. Velocities can be transformed so that the tool 108 is assumed to be stationary, the material 104 flows towards the tool, and a portion of the material 104 gets sheared along the shear planes and flows upwards as the chip. After such a transformation, streamlines of velocity can be constructed by tracking how a material point moves over time, assuming the same velocity to hold true over time (assuming the instantaneous velocity pattern over the small increment of time corresponding to the small increment of deformation were to continue to exist as a stationary deformation pattern). The streamlines make it easy to determine $\Delta v_\perp$, the component of material velocity perpendicular to the shear plane. A determination can be made whether the material velocities on points along free surfaces of the chip (such as the chip 510 or 610) are tangential to the free surface. In other words, the velocity streamlines originating at all points along the free surface of the material 104 (such as along a free surface region 506 or 606) coincide with the free surfaces. For instance, in FIG. 5, the free surface region 506 is flowing into the chip, indicating the chip would become thinner. In FIG. 6, the free surface region 606 is moving into the region behind the originally modeled chip, indicating that the chip would become thicker. After several iterative DLO analyses, if the streamlines within the deforming region (the region containing the active shear planes) are found to stabilize, the geometry of the chip can be modified by extending the streamlines beyond the deforming region. Each iteration of the DLO analysis can begin with a new chip geometry that results from an increment of deformation with the previous chip geometry. The chip in each iteration includes material within the extension of the streamlines. By integrating the strain along streamlines (such as by adding the strain due to each slip line that crosses a streamline), the strain distribution within the material can be determined.

As an additional example, the DLO analysis can be extended to compute local temperatures/temperature distributions of the material 104, such as by solving heat transfer equations (like those discussed in Carslaw et al.) or using simpler network models or analytical solutions for the temperature field. An example of how analytical models can be used to estimate the temperature distribution along the most active shear plane (the primary shear plane or zone) and along the chip-tool interface (the secondary shear plane or zone) is provided in Adibi-Sedeh et al., "Extension of Oxley's Analysis of Machining to use Different Material Models," *Journal of Manufacturing Science and Engineering*, 125(4), pp. 656-666, 2003 (which is hereby incorporated by reference in its entirety). The evolution of the temperature field to a steady-state field within the tool 108 can be accelerated in the computations by reducing the specific heat of the tool 108 (excepting a thin zone adjacent to the tool-chip interface) to a small fraction of the actual value as described in detail in Deshpande et al., "A novel approach to accelerate attainment of thermal steady state in coupled thermomechanical analysis of machining", International Journal of Heat and Mass Transfer, 55, pp. 3869-3884, 2012 (which is hereby incorporated by reference in its entirety).

The constitutive model can be used to calculate local flow stresses corresponding to the local strain rate, strain and temperature. The constitutive model can also be used to determine the friction stress at the chip-tool interface, for instance, by assuming that a layer of chip material is stuck to the tool and the friction stress is equal to the flow stress of the material.

It is also possible that adiabatic shear banding occurs, where the streamlines do not reach steady-state and the velocity field changes with time. In these cases, the changes over several iterations of the simulation can be analyzed to identify whether a periodic (oscillatory) deformation pattern has been established. This can be done, for example, by comparing forces, temperature, deformation pattern, etc. from one iteration to others and seeing if the changes are cyclic and to verify that the change from one cycle to the next is insignificant (such as less than a threshold percentage of change).

Three-dimensional (3D) machining processes such as turning, milling, and drilling can be treated as a sum of individual two-dimensional machining processes along equivalent planes. Each equivalent plane represents a plane containing the local material velocity vector (relative to the tool) and the local velocity vector (relative to the tool) of the chip formed from that material. See Adibi-Sedeh et al., "A Hybrid Model for Analysis of 3D Machining Operations", Transactions of NAMRC XXXI, May 20-23, 2003 (which is hereby incorporated by reference in its entirety). The machining processes can therefore be represented as a set of orthogonal cutting operations along equivalent planes. The total cutting forces can be obtained as the sum of the individual contributions along the equivalent planes into which the engagement between the tool 108 and work material 104 can be divided. If the peak temperature is of primary interest, only the equivalent plane with the largest local depth of cut may need to be analyzed.

In addition, the DLO analysis can be used to obtain approximate strain rate distributions in the material 104 as described previously. This can be used to adaptively adjust the grid spacing, reducing the grid spacing in regions near shear planes with high strain rate (such as by making the local grid spacing inversely proportional to the local strain rate) and increasing it in regions outside of active shear planes. This could permit the fleshing out of a single shear plane as being comprised of a set of planes that can be said to constitute a shear zone, except near some singular points.

By using the DLO technique as described above, this procedure can be used to efficiently and accurately predict chip geometries and loads for a variety of materials and forming processes. This makes it possible to analyze thermo-mechanical deformations (including tool wear processes) that occur in forming operations. As an example benefit, the analysis can be used to minimize processing costs by identifying maximum productivity conditions while satisfying constraints on part quality, machine capability requirements, and process robustness. Moreover, the DLO analysis can occur much faster than FEA or other conventional approaches using less computational resources.

Although FIGS. 3 through 6 illustrate one example of a functional architecture 300 of a simulator supporting simulation of machining and other forming operations and related details, various changes may be made to FIGS. 3 through 6. For example, the functional architecture 300 could include any additional components, such as components that use the simulation results to perform other functions. Also, FIGS. 4A through 4D show one instance of the analysis that could occur using discontinuity layout optimization, and this instance is provided as an example only. In addition, the structures shown in FIGS. 5 and 6 are examples only, and any other structures and tools could be simulated.

FIGS. 7A through 7J illustrate example results of multiple iterations of a technique for simulation of machining and other forming operations according to this disclosure. In this example, the material 104 is assumed to be fed towards a stationary tool 108, which is for ease of simulation only. As can be seen in FIGS. 7A through 7J, a portion 702 of the material 104 near the tip of the tool 108 generally grows in size as the tool 108 is simulated to cut through the material 104. The jagged left edges 704 of the portion 702 generally indicate that the material 108 is deforming along a sliding shear plane, which remains the most active shear plane for a finite amount of deformation. Note that while the right edge 706 of the lower portion of the material 104 below the tool 108 and the upper edge 708 of the chip above the tool 108 appear to remain in fixed positions, these boundaries do not represent fixed edges of the material 104.

Figure 8:
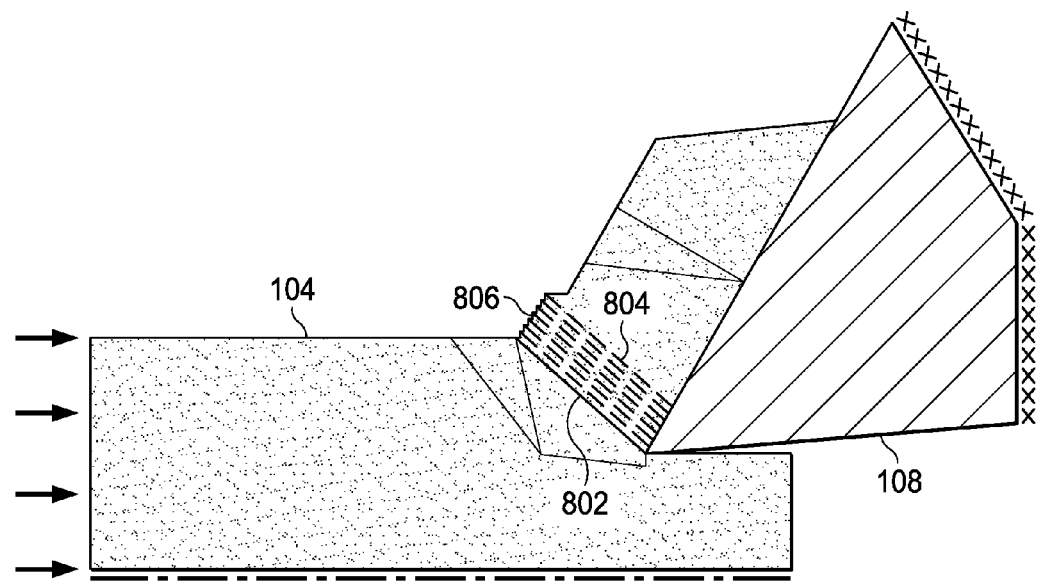
FIG. 8 illustrates an example movement of the most active shear plane as material is fed towards a tool during simulation of machining and other forming operations according to this disclosure.

FIG. 8 illustrates an example movement of the most active shear plane as the material 104 is fed towards the tool 108 during simulation of machining and other forming operations according to this disclosure. In particular, the sliding shear plane is shown in greater detail in FIG. 8, where a solid line 802 denotes the current location of an active shear plane and dashed lines 804 denote prior locations of the active shear plane, the material adjoining which having become part of the chip and moving with the chip. As can be seen here, the shear plane changes as the material 104 is simulated to move towards the tool 108, leading to the creation of a jagged edge 806. The jagged edge 806 is created as pieces of the material 104 slide finite distances with respect to one another along the active shear plane.

Figure 7A:
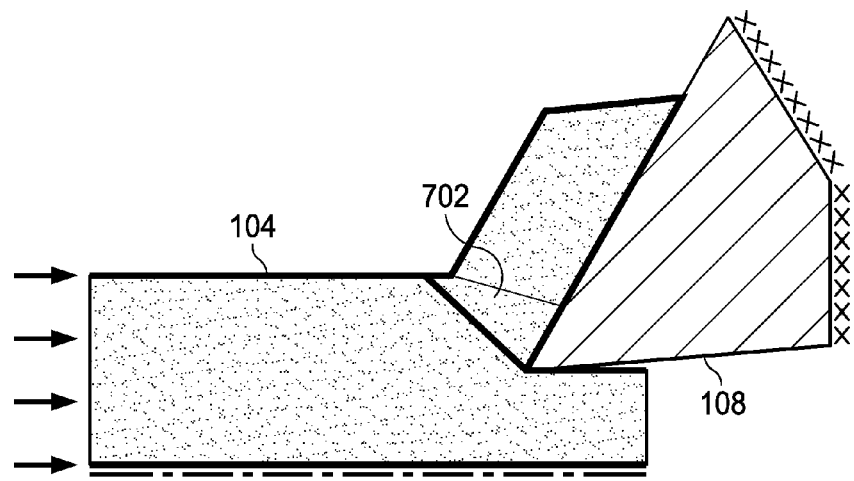
FIGS. 7A through 7J illustrate example results of multiple iterations of a technique for simulation of machining and other forming operations according to this disclosure.
Figure 7B:
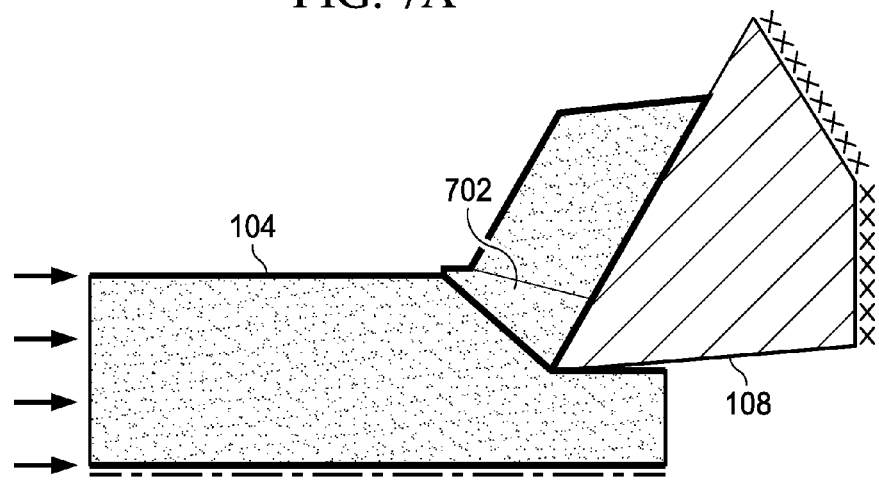
Figure 7C:
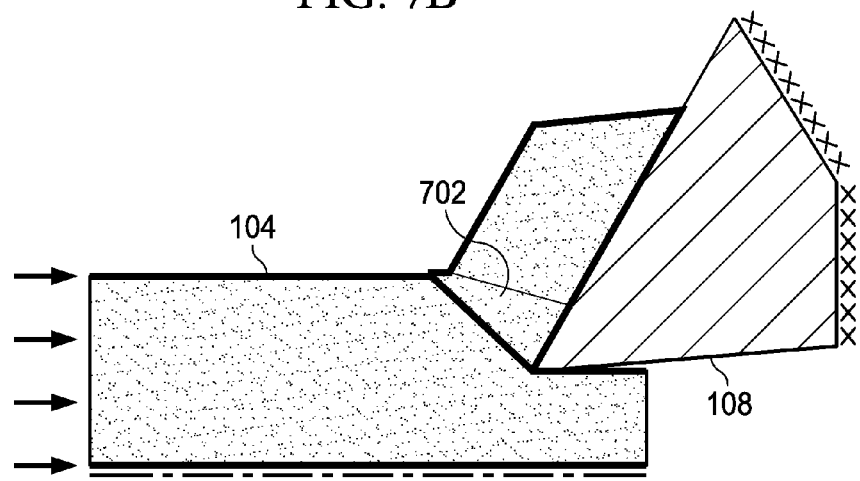
Figure 7D:
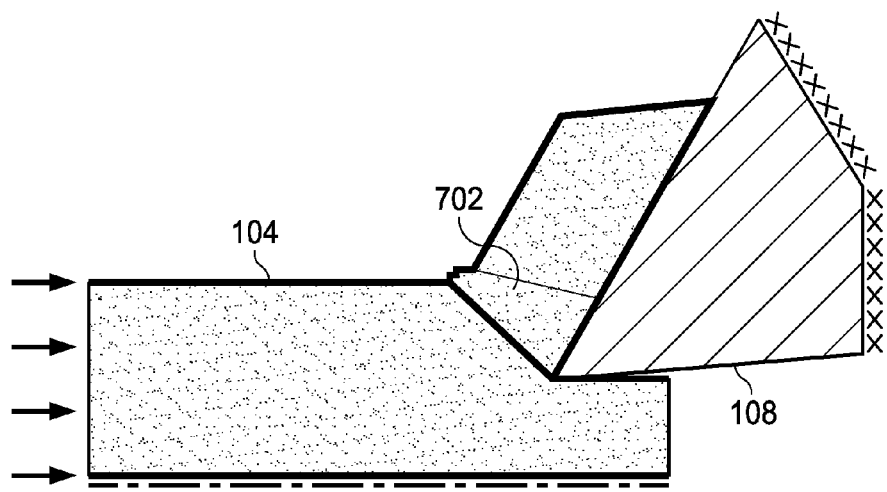
Figure 7E:
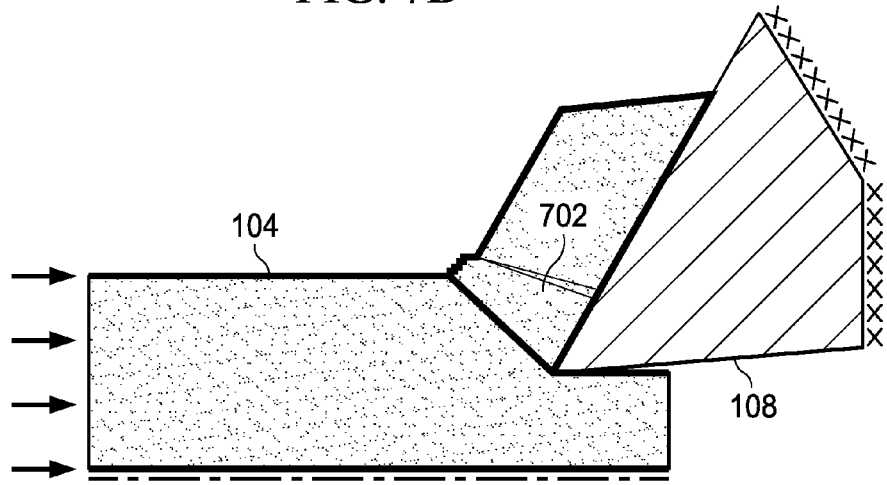
Figure 7F:
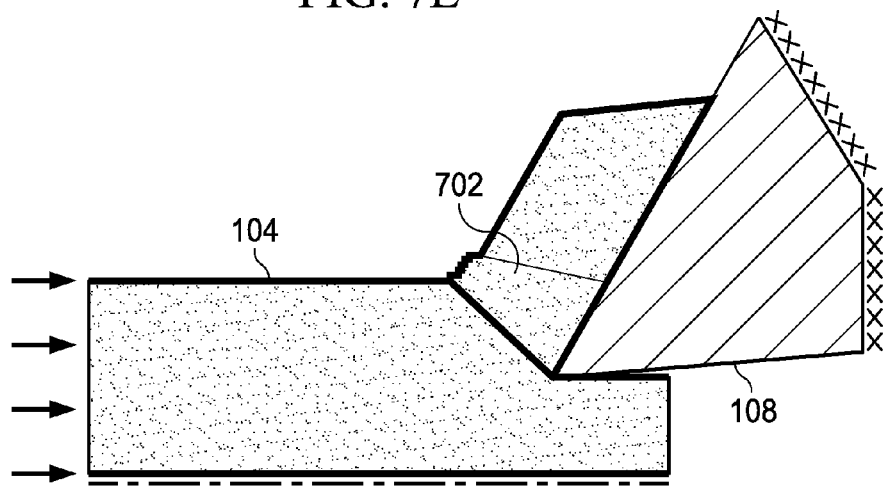
Figure 7G:
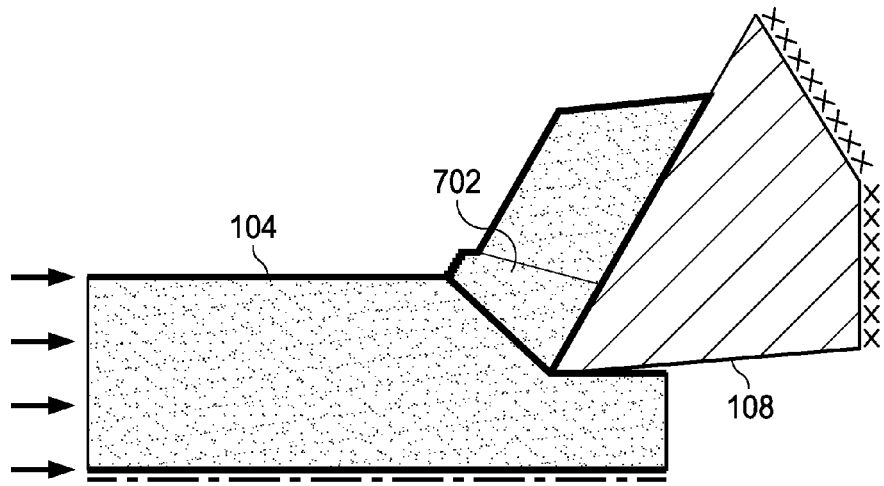
Figure 7H:
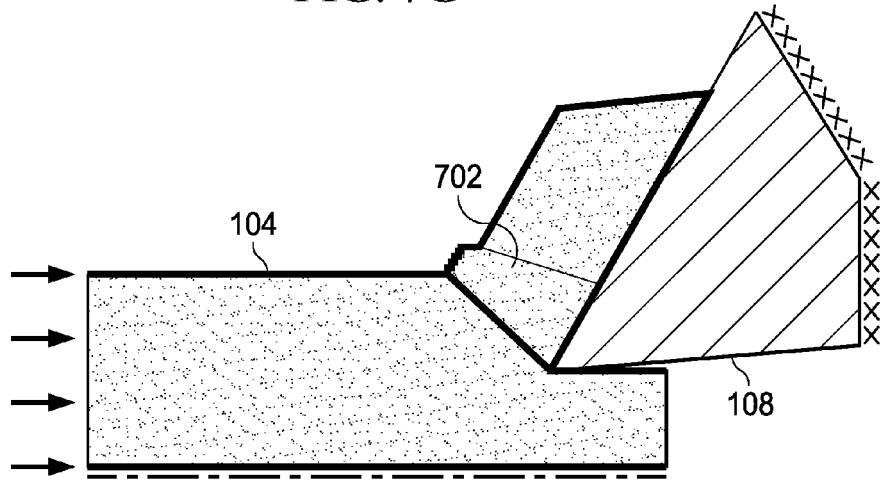
Figure 7I:
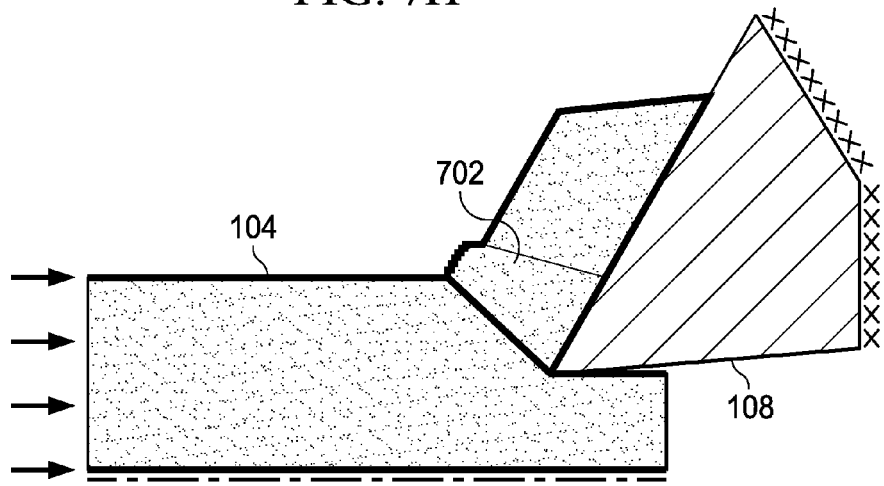
Figure 7J:
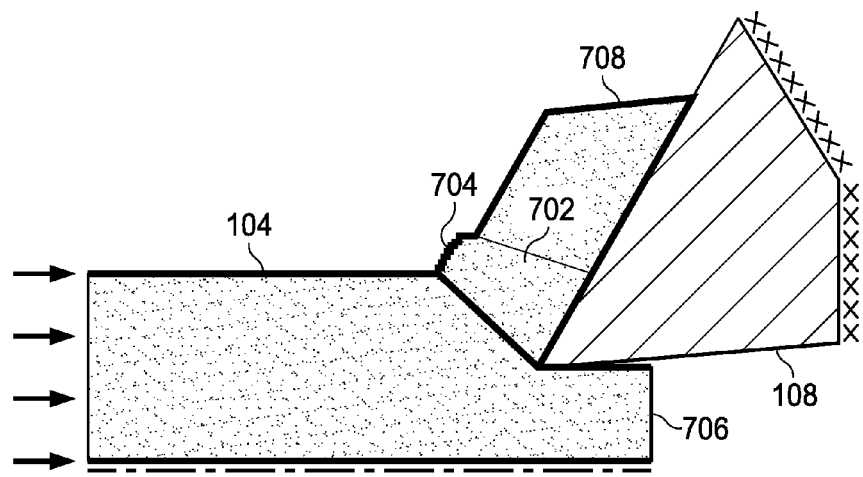

Although FIGS. 7A through 8 provide examples of how deformations of material during forming operations can be simulated using DLO techniques, the contents of these figures represent one example of how the deformations may occur. Other deformations, such as those that occur during the use of a different tool, could also be simulated using the DLO techniques described above.

Figure 9:
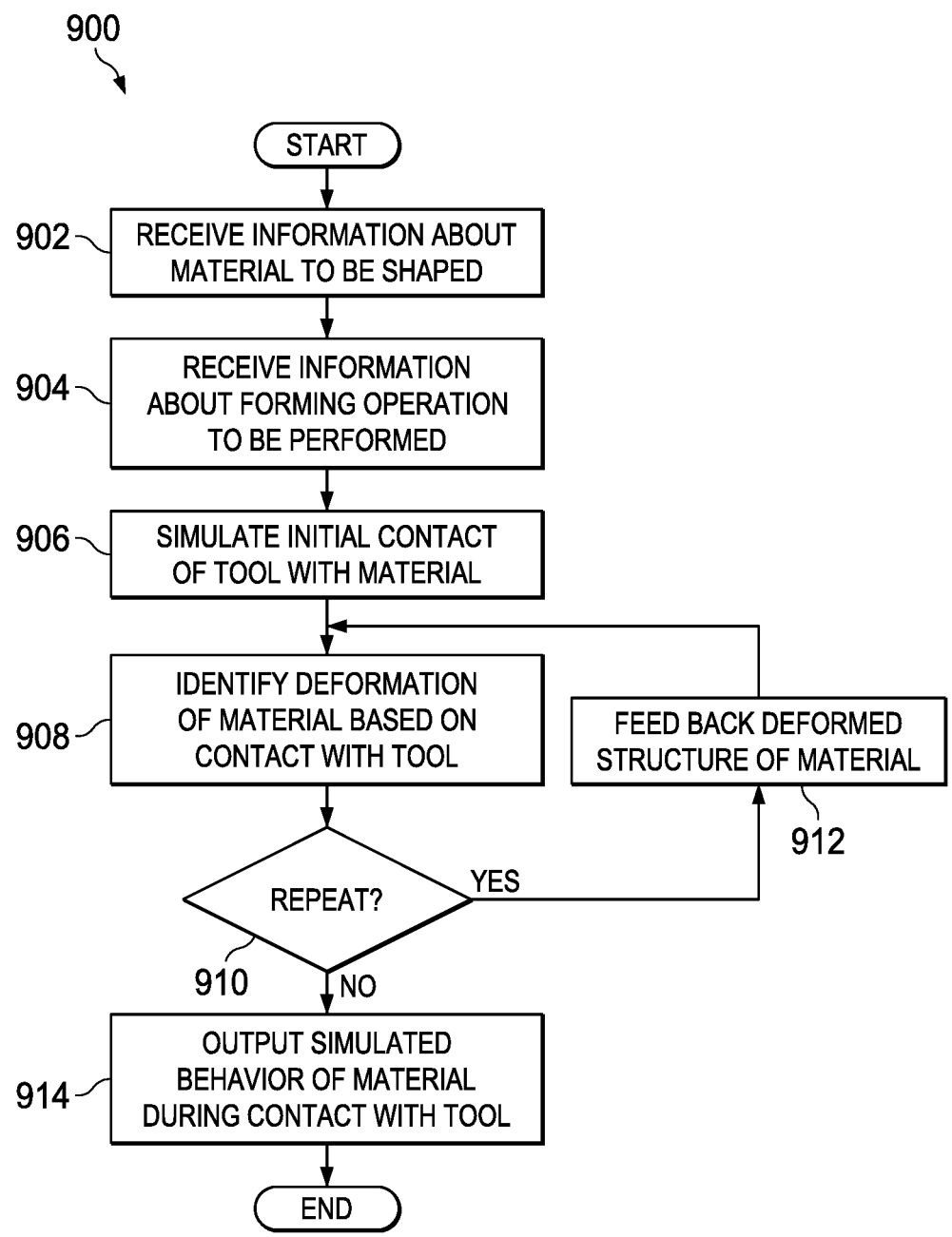
FIG. 9 illustrates an example method for simulation of machining and other forming operations according to this disclosure.

FIG. 9 illustrates an example method 900 for simulation of machining and other forming operations according to this disclosure. For ease of explanation, the method 900 is described with respect to the simulation platform 114 using the functional architecture 300 operating in the system 100. The method 900 could be used with any other suitable simulator and in any other suitable system.

As shown in FIG. 9, information about material to be shaped is received at step 902, and information about a forming operation to be performed is received at step 904. This could include, for example, the DLO engine 306 receiving information defining the material 104 to be processed, such as the size, shape, dimensions, and composition of the material 104. This could also include the DLO engine 306 receiving information defining the tool 108 to be used to process the material 104 and the intended movement of the tool 108 to occur during the processing. This information could be obtained in any suitable manner, such as from a user.

The initial contact of the tool with the material is simulated at step 906, and the deformation of the material based on this contact is identified at step 908. This could include, for example, the DLO engine 306 estimating the initial shear planes in the material 104 and the likely plane or planes where the material 104 may deform based on the contact with the tool 108. Thus, the DLO engine 306 can predict initial chip formation in the material 104.

A determination is made whether to perform another iteration at step 910. This could include, for example, the DLO engine 306 determining whether a specified number of iterations have occurred or whether the changes from one iteration to the next are insignificant.

If a determination is made to perform another iteration, the deformed structure of the material is fed back as the current structure at step 912, and the process returns to step 908 to identify further deformation of the material based on contact with the tool. Otherwise, the simulated behavior of the material is output at step 914. This could include, for example, the DLO engine 306 outputting data identifying an estimated series of deformations of the material 104 caused by contact with the tool 108. These results could be used in any suitable manner, such as to help optimize actual operations of a CNC manufacturing machine 102.

Although FIG. 9 illustrates one example of a method 900 for simulation of machining and other forming operations, various changes may be made to FIG. 9. For example, while shown as a series of steps, various steps in FIG. 9 could overlap, occur in parallel, occur in a different order, or occur multiple times.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   obtaining information associated with a forming operation involving a manufacturing machine having a tool that contacts material; and
   simulating deformation of the material based on the information, wherein simulating the deformation of the material comprises:
   using discontinuity layout optimization to:
      evaluate combinations of shear planes within an initial structure of the material;

predict a mode of deformation comprising one or more of the shear planes along which the initial structure of the material will likely deform; and
calculate a deformed shape of the material after an increment of deformation along the predicted mode of deformation; and
repeating the discontinuity layout optimization with the deformed shape of the material as the initial structure;
wherein using the discontinuity layout optimization comprises:
checking if limits on intensities of stress at pressure singularities within the material are satisfied; and
excluding potential modes of deformation that violate the limits.

2. The method of claim 1, wherein using the discontinuity layout optimization comprises calculating flow stress over each local volume of the material.

3. The method of claim 1, wherein using the discontinuity layout optimization comprises:
transforming velocities associated with the material so that the tool is assumed to be stationary; and
simulating flows of the material through a control volume.

4. The method of claim 1, wherein the discontinuity layout optimization is repeated multiple times to simulate formation of multiple chips removed from the material during the forming operation.

5. The method of claim 4, further comprising:
simulating the forming operation in three dimensions as a set of orthogonal cutting operations along equivalent planes within the material.

6. The method of claim 1, further comprising:
modeling heat generated due to the deformation; and
using the modeled heat to calculate temperature distributions within the tool and the material.

7. The method of claim 6, further comprising:
calculating a strain rate along each of the shear planes;
calculating a strain by integrating the strain along velocity streamlines; and
calculating a flow stress over each local volume of the material using a local temperature, the strain rate, and the strain.

8. A method comprising:
obtaining information associated with a forming operation involving a manufacturing machine having a tool that contacts material; and
simulating deformation of the material based on the information, wherein simulating the deformation of the material comprises:
using discontinuity layout optimization to:
evaluate combinations of shear planes within an initial structure of the material;
predict a mode of deformation comprising one or more of the shear planes along which the initial structure of the material will likely deform; and
calculate a deformed shape of the material after an increment of deformation along the predicted mode of deformation; and
repeating the discontinuity layout optimization with the deformed shape of the material as the initial structure;
wherein using the discontinuity layout optimization comprises:
transforming velocities associated with the material so that the tool is assumed to be stationary;
simulating flows of the material through a control volume;
determining whether the velocities associated with the material on points along free surfaces of the tool are tangential to the free surfaces;
if so, terminating the simulating; and
if not, modifying the geometry of the flows of the material and continuing the simulating.

9. A method comprising:
obtaining information associated with a forming operation involving a manufacturing machine having a tool that contacts material; and
simulating deformation of the material based on the information, wherein simulating the deformation of the material comprises:
using discontinuity layout optimization to:
evaluate combinations of shear planes within an initial structure of the material;
predict a mode of deformation comprising one or more of the shear planes along which the initial structure of the material will likely deform; and
calculate a deformed shape of the material after an increment of deformation along the predicted mode of deformation; and
repeating the discontinuity layout optimization with the deformed shape of the material as the initial structure;
wherein using discontinuity layout optimization comprises:
identifying multiple nodes within the material;
identifying potential discontinuities between the nodes; and
identifying a subset of the discontinuities as the one or more shear planes along which the initial structure of the material will likely deform;
wherein a spacing of the nodes within the material is adaptive based on strain rate distributions in the material.

10. The method of claim 9, wherein using the discontinuity layout optimization comprises:
checking if limits on intensities of stress at pressure singularities within the material are satisfied; and
excluding potential modes of deformation that violate the limits.

11. An apparatus comprising:
at least one memory configured to store information associated with a forming operation involving a manufacturing machine having a tool that contacts material; and
at least one processing device configured to simulate deformation of the material based on the information by:
using discontinuity layout optimization to:
evaluate combinations of shear planes within an initial structure of the material;
predict a mode of deformation comprising one or more of the shear planes along which the initial structure of the material will likely deform; and
calculate a deformed shape of the material after an increment of deformation along the predicted mode of deformation; and
repeating the discontinuity layout optimization with the deformed shape of the material as the initial structure;
wherein the at least one processing device is configured to use the discontinuity layout optimization by:
checking if limits on intensities of stress at pressure singularities within the material are satisfied; and excluding potential modes of deformation that violate the limits.

12. The apparatus of claim 11, wherein the at least one processing device is configured to use the discontinuity layout optimization by calculating flow stress over each local volume of the material.

13. The apparatus of claim 11, wherein the at least one processing device is configured to use the discontinuity layout optimization by:
 transforming velocities associated with the material so that the tool is assumed to be stationary; and
 simulating flows of the material through a control volume.

14. The apparatus of claim 11, wherein the at least one processing device is configured to repeat the discontinuity layout optimization multiple times to simulate formation of multiple chips removed from the material during the forming operation.

15. The apparatus of claim 14, wherein the at least one processing device is further configured to output information identifying results of the multiple repetitions of the discontinuity layout optimization.

16. The apparatus of claim 14, wherein the at least one processing device is further configured to simulate the forming operation in three dimensions as a set of orthogonal cutting operations along equivalent planes within the material.

17. The apparatus of claim 11, wherein the at least one processing device is further configured to:
 model heat generated due to the deformation; and
 use the modeled heat to calculate temperature distributions within the tool and the material.

18. An apparatus comprising:
 at least one memory configured to store information associated with a forming operation involving a manufacturing machine having a tool that contacts material; and
 at least one processing device configured to simulate deformation of the material based on the information by:
  using discontinuity layout optimization to:
   evaluate combinations of shear planes within an initial structure of the material;
   predict a mode of deformation comprising one or more of the shear planes along which the initial structure of the material will likely deform; and
   calculate a deformed shape of the material after an increment of deformation along the predicted mode of deformation; and
  repeating the discontinuity layout optimization with the deformed shape of the material as the initial structure;
 wherein the at least one processing device is configured to use the discontinuity layout optimization by:
  transforming velocities associated with the material so that the tool is assumed to be stationary;
  simulating flows of the material through a control volume;
  determining whether the velocities associated with the material on points along free surfaces of the tool are tangential to the free surfaces;
  if so, terminating the simulating; and
  if not, modifying the geometry of the flows of the material and continuing the simulating.

19. The apparatus of claim 18, wherein the at least one processing device is configured to use the discontinuity layout optimization by:

checking if limits on intensities of stress at pressure singularities within the material are satisfied; and
excluding potential modes of deformation that violate the limits.

20. An apparatus comprising:
 at least one memory configured to store information associated with a forming operation involving a manufacturing machine having a tool that contacts material; and
 at least one processing device configured to simulate deformation of the material based on the information by:
  using discontinuity layout optimization to:
   evaluate combinations of shear planes within an initial structure of the material;
   predict a mode of deformation comprising one or more of the shear planes along which the initial structure of the material will likely deform; and
   calculate a deformed shape of the material after an increment of deformation along the predicted mode of deformation; and
  repeating the discontinuity layout optimization with the deformed shape of the material as the initial structure;
 wherein the at least one processing device is configured to use the discontinuity layout optimization by:
  identifying multiple nodes within the material;
  identifying potential discontinuities between the nodes; and
  identifying a subset of the discontinuities as the one or more shear planes along which the initial structure of the material will likely deform;
 wherein a spacing of the nodes within the material is adaptive based on strain rate distributions in the material.

21. A non-transitory computer readable medium embodying a computer program, the computer program comprising computer readable program code that when executed causes at least one processor to:
 obtain information associated with a forming operation involving a manufacturing machine having a tool that contacts material; and
 simulate deformation of the material based on the information by:
  using discontinuity layout optimization to:
   evaluate combinations of shear planes within an initial structure of the material;
   predict a mode of deformation comprising one or more of the shear planes along which the initial structure of the material will likely deform; and
   calculate a deformed shape of the material after an increment of deformation along the predicted mode of deformation; and
  repeating the discontinuity layout optimization with the deformed shape of the material as the initial structure;
 wherein the computer readable program code that when executed causes the at least one processor to use the discontinuity layout optimization comprises computer readable program code that when executed causes the at least one processor to:
  check if limits on intensities of stress at pressure singularities within the material are satisfied; and
  exclude potential modes of deformation that violate the limits.

22. The non-transitory computer readable medium of claim 21, wherein the computer readable program code that when executed causes the at least one processor to use the discontinuity layout optimization comprises computer readable program code that when executed causes the at least one processor to calculate flow stress over each local volume of the material.

23. The non-transitory computer readable medium of claim 21, wherein the computer readable program code that when executed causes the at least one processor to use the discontinuity layout optimization comprises computer readable program code that when executed causes the at least one processor to:
transform velocities associated with the material so that the tool is assumed to be stationary; and
simulate flows of the material through a control volume.

24. The non-transitory computer readable medium of claim 21, wherein the computer readable program code that when executed causes the at least one processor to repeat the discontinuity layout optimization comprises computer readable program code that when executed causes the at least one processor to repeat the discontinuity layout optimization multiple times to simulate formation of multiple chips removed from the material during the forming operation.

25. The non-transitory computer readable medium of claim 24, wherein the computer program further comprises computer readable program code that when executed causes the at least one processor to output information identifying results of the multiple repetitions of the discontinuity layout optimization.

26. The non-transitory computer readable medium of claim 24, wherein the computer program further comprises computer readable program code that when executed causes the at least one processor to simulate the forming operation in three dimensions as a set of orthogonal cutting operations along equivalent planes within the material.

27. The non-transitory computer readable medium of claim 21, wherein the computer program further comprises computer readable program code that when executed causes the at least one processor to:
model heat generated due to the deformation; and
use the modeled heat to calculate temperature distributions within the tool and the material.

28. A non-transitory computer readable medium embodying a computer program, the computer program comprising computer readable program code that when executed causes at least one processor to:
obtain information associated with a forming operation involving a manufacturing machine having a tool that contacts material; and
simulate deformation of the material based on the information by:
using discontinuity layout optimization to:
evaluate combinations of shear planes within an initial structure of the material;
predict a mode of deformation comprising one or more of the shear planes along which the initial structure of the material will likely deform; and
calculate a deformed shape of the material after an increment of deformation along the predicted mode of deformation; and
repeating the discontinuity layout optimization with the deformed shape of the material as the initial structure;
wherein the computer readable program code that when executed causes the at least one processor to use the discontinuity layout optimization comprises computer readable program code that when executed causes the at least one processor to:
transform velocities associated with the material so that the tool is assumed to be stationary;
simulate flows of the material through a control volume;
determine whether the velocities associated with the material on points along free surfaces of the tool are tangential to the free surfaces;
if so, terminate the simulating; and
if not, modify the geometry of the flows of the material and continuing the simulating.

29. The non-transitory computer readable medium of claim 28, wherein the computer readable program code that when executed causes the at least one processor to use the discontinuity layout optimization comprises computer readable program code that when executed causes the at least one processor to:
check if limits on intensities of stress at pressure singularities within the material are satisfied; and
exclude potential modes of deformation that violate the limits.

30. A non-transitory computer readable medium embodying a computer program, the computer program comprising computer readable program code that when executed causes the at least one processor to:
obtain information associated with a forming operation involving a manufacturing machine having a tool that contacts material; and
simulate deformation of the material based on the information by:
using discontinuity layout optimization to:
evaluate combinations of shear planes within an initial structure of the material;
predict a mode of deformation comprising one or more of the shear planes along which the initial structure of the material will likely deform; and
calculate a deformed shape of the material after an increment of deformation along the predicted mode of deformation; and
repeating the discontinuity layout optimization with the deformed shape of the material as the initial structure;
wherein the computer readable program code that when executed causes the at least one processor to use discontinuity layout optimization comprises computer readable program code that when executed causes the at least one processor to:
identify multiple nodes within the material;
identify potential discontinuities between the nodes; and
identify a subset of the discontinuities as the one or more shear planes along which the initial structure of the material will likely deform;
wherein a spacing of the nodes within the material is adaptive based on strain rate distributions in the material.

* * * * *